United States Patent
Ho et al.

(10) Patent No.: US 9,887,229 B2
(45) Date of Patent: Feb. 6, 2018

(54) SENSING CHIP PACKAGE AND A MANUFACTURING METHOD THEREOF

(71) Applicant: XINTEC INC., Taoyuan (TW)

(72) Inventors: Yen-Shih Ho, Kaohsiung (TW); Tsang-Yu Liu, Zhubei (TW); Chia-Sheng Lin, Taoyuan (TW); Chia-Ming Cheng, New Taipei (TW)

(73) Assignee: XINTEC INC., Taoyuan (TW)

( * ) Notice: Subject to any disclaimer, the term of this patent is extended or adjusted under 35 U.S.C. 154(b) by 0 days.

(21) Appl. No.: 15/226,327

(22) Filed: Aug. 2, 2016

(65) Prior Publication Data
US 2017/0040372 A1 Feb. 9, 2017

Related U.S. Application Data

(60) Provisional application No. 62/200,876, filed on Aug. 4, 2015.

(51) Int. Cl.
*H01L 27/146* (2006.01)
(52) U.S. Cl.
CPC .... *H01L 27/14636* (2013.01); *H01L 27/1464* (2013.01); *H01L 27/14687* (2013.01)
(58) Field of Classification Search
None
See application file for complete search history.

(56) References Cited

U.S. PATENT DOCUMENTS

| | | | | |
|---|---|---|---|---|
| 2011/0171827 | A1* | 7/2011 | Farooq | H01L 21/0337 438/653 |
| 2013/0020468 | A1* | 1/2013 | Mitsuhashi | H01L 27/14645 250/208.1 |
| 2013/0168850 | A1* | 7/2013 | Samoilov | H01L 21/76898 257/737 |
| 2013/0264688 | A1* | 10/2013 | Qian | H01L 23/481 257/622 |

(Continued)

*Primary Examiner* — Sitaramarao S Yechuri
(74) *Attorney, Agent, or Firm* — Liu & Liu (57) ABSTRACT

This present invention provides a method of manufacturing a chip scale sensing chip package, comprising the steps of: providing a sensing device wafer having a first top surface and a first bottom surface opposite to each other, whereby the sensing device wafer comprises a plurality of chip areas, and each of the chip areas comprising a sensing device and a plurality of conductive pads adjacent to the sensing chip nearby the first top surface; providing a cap wafer having a second top surface and a second bottom surface opposite to each other, and bonding the second surface of the cap wafer to the first top surface of the sensing device wafer by sandwiching a first adhesive layer therebetween; providing a temporary carrier substrate, and bonding the temporary carrier substrate to the second top surface of the cap wafer by sandwiching a second adhesive layer therebetween; forming a wiring layer connecting to each of the conductive pads on the first bottom surface of the sensing device wafer; providing a first protective layer on the wiring layer; removing the temporary carrier substrate and the second adhesive layer; forming a second protective layer on the second top surface; removing the first protective layer; scribing the chip areas to generate a plurality of individual chip scale sensing chip package; and removing the second protective layer.

4 Claims, 10 Drawing Sheets

(56) References Cited

U.S. PATENT DOCUMENTS

2014/0264709 A1* 9/2014 Tsai ................... H01L 23/481
                                                257/459
2014/0353839 A1* 12/2014 Lin ................... H01L 23/481
                                                257/774

* cited by examiner

SENSING CHIP PACKAGE AND A MANUFACTURING METHOD THEREOF

This application claims the benefit of U.S. provisional application No. 62/200,876, filed on Aug. 4, 2015, and the entirety of which is incorporated by reference herein.

BACKGROUND OF THE INVENTION

Field of the Invention

The present invention relates to a sensing chip package and in particular relates to a backside illumination sensing chip package and a manufacturing method thereof.

Description of the Related Art

Requirements on electronic products are becoming challenging in consumers market, and therefore devices such as CMOS image sensors (Image Sensor, CIS) applied in those electronic products are keeping developed. Among various technologies, backside Illumination (Backside Illumination, BSI) and through silicon via (through silicon via, TSV) technologies are gradually emerging and becoming a focus on CISs technologies. Traditional CISs are fabricated in frontside Illumination (FSI) technology. In FSI technology, an optical diode is fabricated in front-end-of-line, and interconnections are fabricated in back-end-of-line. The interconnections are disposed above the optical diode. Therefore, lights pass through the interconnections before arrive the optical diode, and therefore interferences might occur before the optical diode detects the lights. Accordingly, resolution of traditional CISs fabricated in FSI is limited. In contrast, in BSI technology, the optical diode and the interconnections are flipped upside down in a flip packaging, and therefore lights could directly arrive the optical diode without passing through the interconnections. The flip packaging could also be applied in various device packages in addition to CIS device package. Accordingly, a more reliable electronic device package and a fabrication method thereof, which is more suitable for mass production, have become one of important issues in electronics industry.

Accordingly, this invention provides an electronic device package and a fabrication method thereof. The method of fabricating the electronic device package has simplified process operations and increased process margin (process window) such that the conductive path within the device package could be formed effectively. Therefore, the device package fabricated has higher reliability and lower cost than those of prior arts. In addition, the layout design of the connecting pads of the device could be more flexible for optimizing efficiency of the device.

SUMMARY OF THE INVENTION

A feature of this invention provides a sensing chip package, comprising: a first substrate, having a first top surface and a first bottom surface opposite to each other, and a first inter-layered dielectric layer (ILD) comprising a first conductive pad and a second conductive pad is formed on the first top surface; a second substrate, having a second top surface and a second bottom surface opposite to each other, and a second inter-layer dielectric layer (ILD) comprising a third conductive pad, whereby the second substrate is bonded to the first inter-layered dielectric layer on the first substrate by the second inter-layered dielectric layer; a first through hole passing through the second substrate, the second inter-layered dielectric layer and part of the first inter-layered dielectric layer to expose the top of the first conductive pad; a second through hole passing through the second substrate and part of the second inter-layered dielectric layer to expose the top of the third conductive pad; a first insulating layer formed on the second top surface of the second substrate and the inner-walls of the first through hole and the second through hole, whereby a first via exposing the first conductive pad and a second via exposing the third conductive pad are respectively formed on the first insulating layer on the bottom of the first through hole and the second through hole; a first re-distribution layer formed on the first insulating layer and gap-filled into the first through hole and the second through hole, and interconnected the first conductive pad through the first via and interconnected the third conductive pad through the second via; and a passivation layer formed on the second top surface of the second substrate, and overlay the first re-distribution layer and the first insulating layer.

Another feature of this invention provides a sensing chip package as mentioned above, further comprising: a third through hole passing through the first substrate and part of the first inter-layered dielectric layer to expose the bottom of the second conductive pad; a second insulating layer formed on the first bottom surface of the first substrate and the inner-wall of the third through hole, whereby a third via exposing the bottom of the second conductive pad is formed on the second insulating layer on the bottom of the third through hole; a second re-distribution layer formed on the second insulating layer, and electrically connected to the first conductive pad and the second conductive pad; a second passivation layer formed on the second re-distribution layer, and the second passivation layer having a fourth opening and a fifth opening exposing the second re-distribution respectively; and a first conductive structure and a second conductive structure respectively formed in the fourth via and the fifth via to independently interconnect the second re-distribution layer.

Another feature of this invention provides a sensing chip package as mentioned above, wherein the first conductive pad does not overlap with the third conductive pad.

Another feature of this invention provides a sensing chip package as mentioned above, the first insulating layer is consisted of a material comprising silicon oxide.

Another feature of this invention provides a sensing chip package as mentioned above, the first re-distribution layer is consisted of a material comprising aluminum.

Another feature of this invention provides a sensing chip package as mentioned above, wherein the first re-distribution further comprises an adhesion layer consisted of a material selected from chromium, titanium or titanium tungsten.

Another feature of this invention provides a sensing chip package as mentioned above, the second insulating layer is consisted of a material comprising silicon oxide.

Another feature of this invention provides a sensing chip package as mentioned above, the first conductive structure and the second conductive structure comprising solder balls, solder bumps or conductive pillars.

Another feature of this invention provides another sensing chip package, comprising: a first substrate, having a first top surface and a first bottom surface opposite to each other, and a first inter-layered dielectric layer (ILD) comprising a first conductive pad and a second conductive pad is formed on the first top surface; a second substrate, having a second top surface and a second bottom surface opposite to each other, and a second inter-layer dielectric layer (ILD) comprising a third conductive pad, whereby the second substrate is bonded to the first inter-layered dielectric layer on the first substrate by the second inter-layered dielectric layer; a first insulating layer formed on the second top surface of the second substrate; a fourth through hole comprising a first region corresponding to the first conductive pad and a second region corresponding to the second conductive pad; a second insulating layer formed on the first insulating layer and the inner-wall and the bottom of the fourth through hole; a fifth through hole passing through the second insulating layer, the second inter-layered dielectric layer and part of the first inter-layered dielectric layer to expose the first conductive pad, whereby the fifth through hole interlinks with the fourth through hole; a sixth through passing through the second insulating layer and part of the second inter-layered dielectric layer to expose the third conductive pad, and the sixth through hole interlinks with the fourth through hole; a first re-distribution layer formed on the second insulating layer and gap-filled into the fourth through hole, the fifth through hole and the sixth through hole, and electrically connected to the first conductive pad and the third conductive pad; and a passivation layer formed on the second top surface of the second substrate, and overlay the second re-distribution layer and the first insulating layer.

Another feature of this invention provides a sensing chip package as mentioned above, further comprising: a seventh through hole passing through the first substrate and part of the first inter-layered dielectric layer to expose the bottom of the second conductive pad; a third insulating layer formed on the first bottom surface of the first insulating layer and the inner-wall of the seventh through hole, whereby a seventh via exposing the second conductive pad is formed on the second insulating layer on the bottom of the seventh through hole; a second re-distribution layer formed on the third insulating layer, and interconnected the second conductive pad through the seventh through hole; a second passivation layer formed on the second re-distribution layer, and the second passivation layer having a eighth via and a ninth via exposing the second re-distribution respectively; and a third conductive structure and a fourth conductive structure respectively formed in the eighth via and the ninth via to independently interconnect the second re-distribution layer.

Another feature of this invention provides a sensing chip package as mentioned above, wherein the first conductive pad overlaps with the second conductive pad.

Another feature of this invention provides a sensing chip package as mentioned above, the first insulating layer is consisted of a material comprising silicon oxide.

Another feature of this invention provides a sensing chip package as mentioned above, the second insulating layer is consisted of a material comprising silicon oxide.

Another feature of this invention provides a sensing chip package as mentioned above, the first re-distribution layer is consisted of a material comprising aluminum.

Another feature of this invention provides a sensing chip package as mentioned above, wherein the first re-distribution further comprises an adhesion layer consisted of a material selected from chromium, titanium or titanium tungsten.

Another feature of this invention provides a sensing chip package as mentioned above, the third conductive structure and the fourth conductive structure comprising solder balls, solder bumps or conductive pillars.

Another feature of this invention provides a method of manufacturing a sensing chip package, comprising the steps of: providing a first substrate, having a first top surface and a first bottom surface opposite to each other, and a first inter-layered dielectric layer (ILD) comprising a first conductive pad and a second conductive pad is formed on the first top surface; providing a second substrate, a second substrate, having a second top surface and a second bottom surface opposite to each other, and a second inter-layer dielectric layer (ILD) comprising a third conductive pad, whereby the second substrate is bonded to the first inter-layered dielectric layer on the first substrate by the second inter-layered dielectric layer; pressing the second substrate to attach the first inter-layer dielectric layer (ILD) of the first substrate by means of the second inter-layer dielectric layer (ILD); forming a first through hole and a second through hole, whereby the first through hole passes through the second substrate, the second inter-layered dielectric layer and part of the first inter-layered dielectric layer; forming a first insulating layer on the second top surface of the second substrate and the side-wall and the bottom of the first through hole and the second through hole; removing part or all of the first insulating layer on the bottom of the first through hole and the second through hole to respectively form a first via on the bottom of the first through hole and a second via on the bottom of the second through hole; forming a first re-distribution layer on the first insulating layer and gap-filling into the first through hole and the second through hole, and interconnecting the first conductive pad through the first via and interconnecting the third conductive pad through the second via; and forming a passivation layer formed on the second top surface of the second substrate, and overlying the first re-distribution layer and the first insulating layer.

Another feature of this invention provides a method of manufacturing a sensing chip package as mentioned above, further comprising following steps of: thinning the first bottom surface of the first substrate; forming a third through hole passing through the first substrate and part of the first inter-layered dielectric layer to expose the bottom of the second conductive pad; forming a second insulating layer on the first bottom surface of the first substrate and the inner-wall of the third through hole; removing all or part of the second insulating layer on the bottom of the third through hole to form a third via exposing the bottom of the second conductive pad; forming a second re-distribution layer on the second insulating layer to interconnect the second conductive pad through the third via; forming a second passivation layer on the second re-distribution layer, and the second passivation layer having a fifth via and a sixth via exposing the second re-distribution respectively; and forming a first conductive structure and a second conductive structure respectively formed in the fifth via and the sixth via to independently interconnect the second re-distribution layer.

Another feature of this invention provides another method of manufacturing another sensing chip package, comprising the steps of: providing a first substrate, having a first top surface and a first bottom surface opposite to each other, and a first inter-layered dielectric layer (ILD) comprising a first conductive pad and a second conductive pad is formed on the first top surface; providing a second substrate, a second substrate, having a second top surface and a second bottom surface opposite to each other, and a second inter-layer dielectric layer (ILD) comprising a third conductive pad, whereby the second substrate is bonded to the first inter-layered dielectric layer on the first substrate by the second inter-layered dielectric layer; pressing the second substrate to attach the first inter-layer dielectric layer (ILD) of the first substrate by means of the second inter-layer dielectric layer (ILD); forming a first insulating layer on the second top surface of the second substrate; forming a single photoresist pattern on the first insulating layer with a hole exposing part of the first insulating layer; forming an opening passing through the first insulating layer by removing the first insulating layer exposed by the hole, the second substrate and part of the second inter-layered dielectric layer beneath; removing the photoresist pattern; forming a second insulating layer on the first insulating layer and the side-wall and the bottom of the opening; removing part or all of the second insulating layer on the bottom of the opening to form a first through hole comprising a first region corresponding to the first conductive pad and a second region corresponding to the second conductive pad; removing the second inter-layered dielectric layer and part of the first inter-layered dielectric layer under the first region corresponding to the first through hole to form a second through hole exposing the top of the first conductive pad, and removing the second inter-layered dielectric layer under the second region corresponding to the first through hole to form a third through hole exposing the top of the third conductive pad, whereby the first through hole interlinks with the second and the third through hole; forming a first re-distribution layer on the first insulating layer and gap-filling into the first through hole, the second through hole and the third through hole, and respectively interconnecting the first conductive pad and the third conductive pad; and forming a passivation layer formed on the second top surface of the second substrate, and overlying the first re-distribution layer and the second insulating layer.

Another feature of this invention provides a method of manufacturing another sensing chip package as mentioned above, further comprising following steps of: thinning the first bottom surface of the first substrate; forming a fourth through hole passing through the first substrate and part of the first inter-layered dielectric layer to expose the bottom of the second conductive pad; forming a third insulating layer on the first bottom surface of the first substrate and the inner-wall and the bottom of the fourth through hole; removing all or part of the third insulating layer on the bottom of the fourth through hole to form a first via exposing the bottom of the second conductive pad; forming a second re-distribution layer on the third insulating layer, and interconnected the second conductive pad through the first via; forming a second passivation layer on the second re-distribution layer, and the second passivation layer having a second via and a third via exposing the second re-distribution respectively; and forming a first and a second conductive structures respectively in the second via and the third via to independently interconnect the second re-distribution layer.

DETAILED DESCRIPTION OF THE INVENTION

The making and using of the embodiments of the present disclosure are discussed in detail below. However, it should be noted that the embodiments provide many applicable inventive concepts that can be embodied in a variety of specific methods. The specific exemplary embodiments discussed are merely illustrative of specific methods to make and use the embodiments, and do not limit the scope of the disclosure.

Exemplary Embodiment 1

A detailed description of the sensing chip package and a method of manufacturing the same according to embodiment 1 of this invention is given below with reference to the accompany FIGS. 1A~1I.

Figure 1A:
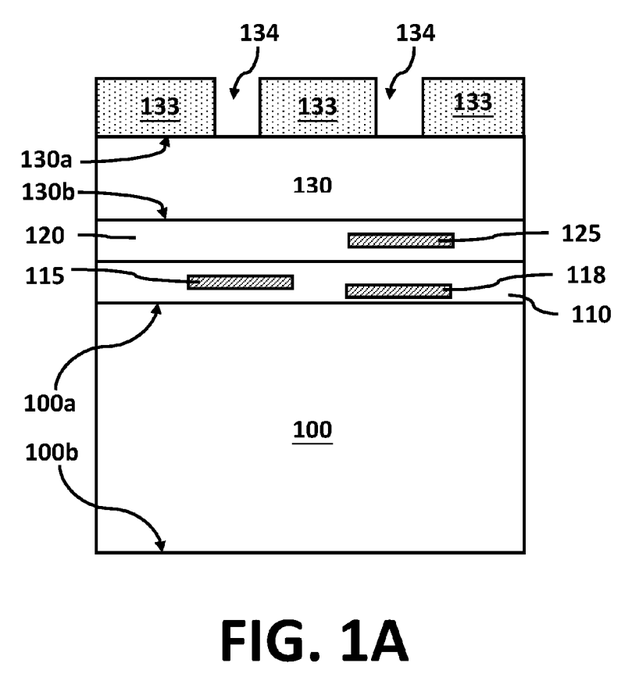
FIGS. 1A~1I are cross-sectional views of the exemplary embodiment 1 of a method of manufacturing a sensing chip package according to this present invention.

First, please refer to FIG. 1A. A first substrate 100 having a first top surface 100a and a first bottom surface 100b opposite to each other is provided, wherein a first inter-layered dielectric layer (ILD) 110 comprising a first conductive pad 115 and a second conductive pad 118 is formed on the first top surface 100a of the first substrate 100. Next, a second substrate 130 having a second top surface 130a and a second bottom surface 130b opposite to each other is provided, wherein a second inter-layer dielectric layer (ILD) 120 comprising a third conductive pad 125 is formed on the second bottom surface 130b of the second substrate 130. Then, the second substrate 130 is pressed to bond to the first inter-layered dielectric layer 110 on the first substrate 100 by means of the second inter-layered dielectric layer 120. Thereafter, a photoresist pattern 133 having an opening 134 is formed on the second top surface 130a of the second substrate 130 by means of photolithography. The first substrate 100 and the second substrate 130 of this embodiment are both silicon wafers comprising image sensors, and the first conductive pad 115 doesn't overlap with the third conductive pad 125.

Figure 1B:
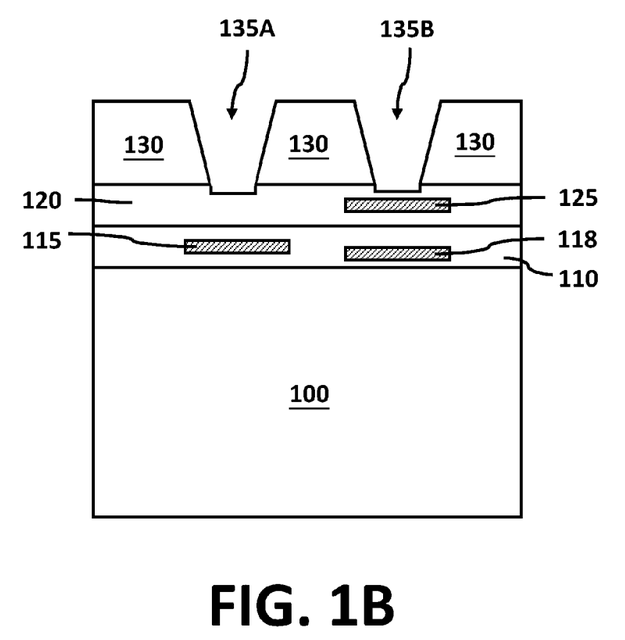

Next, please refer to FIG. 1B. An opening 135A corresponding to the first conductive pad 115 and an opening 135B corresponding to the third conductive pad 125 are respectively formed by etching the exposed second substrate 130 within the opening 134.

Figure 1C:
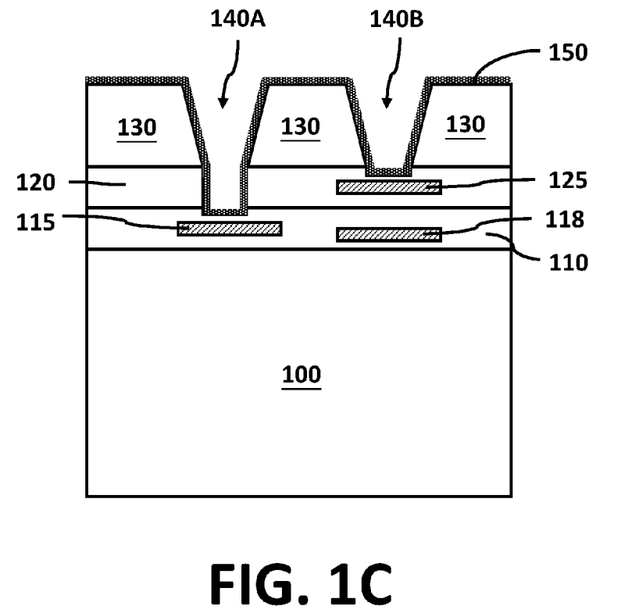

Next, please refer to FIG. 1C. A first through hole 140A and a second through hole 140B are formed by etching the second substrate 130, the second inter-layered dielectric layer 120 and part of the first inter-layered dielectric layer 110 under the openings 135A, and etching the second substrate 130 and part of the second inter-layered dielectric layer 120 under the opening 135B, wherein the first through hole 140A passes through the second substrate 130, the second inter-layered dielectric layer 120 and part of the first inter-layered dielectric layer 110. Thereafter, a first insulating layer 150 is deposited on the second top surface 130a, and the inter-walls (now shown) and the bottoms (not shown) of the first through hole 140A and the second through hole 140B.

Figure 1D:
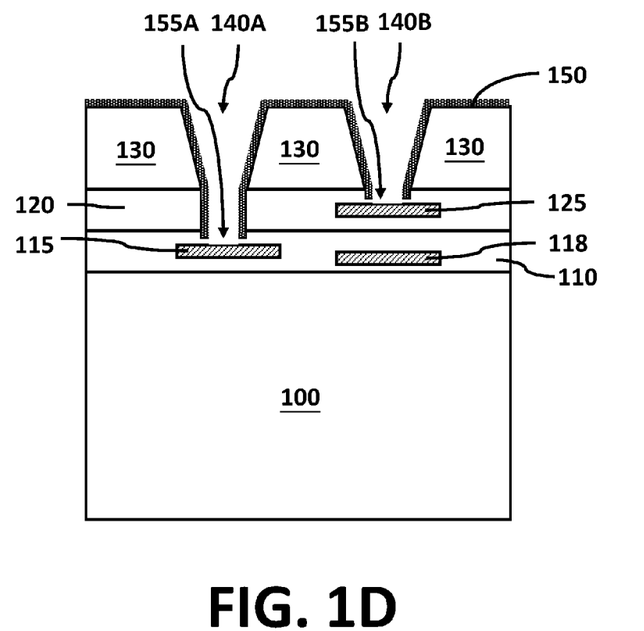

Next, please refer to FIG. 1D. A first via 155A exposing the top of the first conductive pad 115 within the bottom of the first through hole 140A, and a second via 155B exposing the top of the third conductive pad 125 within the bottom of the second through hole 140B are formed by etching part or all of the first insulating layer 150 under the bottoms of first through hole 140A and the second through hole 140B.

Figure 1E:
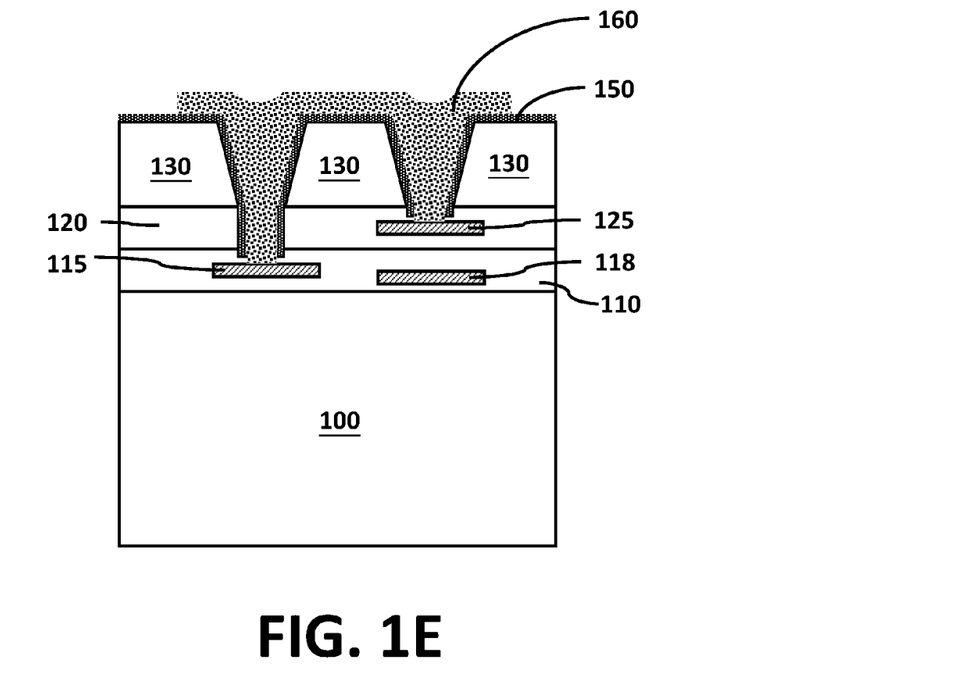

Next, please refer to FIG. 1E. A first re-distribution layer 160 is formed on the first insulating layer 150 and gap-filled into the first through hole 140A and the second through hole 140B by sputtering, and electrically connected to the first conductive pad 115 and the third conductive pad 125 through the first via 155A and the second via 155B respectively. The first re-distribution layer 160 of this embodiment is consisted of a material comprising aluminum, and an adhesive material such as chromium, titanium or titanium tungsten can be sandwiched between the first insulating layer 150 and the first re-distribution layer 160 to increase the adhesion between the first re-distribution layer 160 consisted of a material comprising aluminum and the first conductive pad 115 and the third conductive pad 125.

Figure 1F:
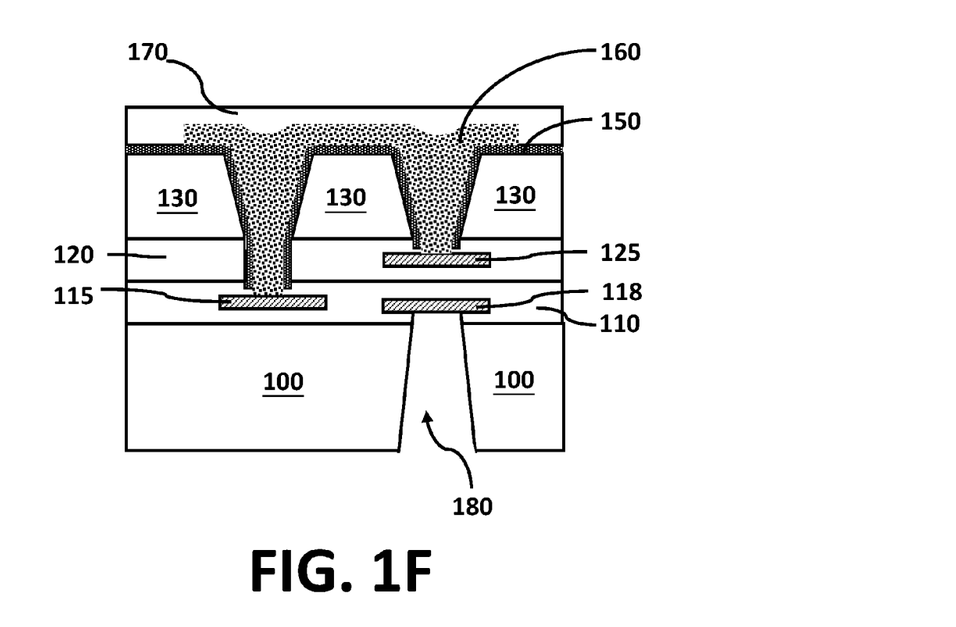

Next, please refer to FIG. 1F. A first passivation layer 170 is formed on the second top surface 130a of the second substrate 130 and overlaid the first re-distribution layer 160 and the first insulating layer 150. Then, the first bottom surface 100b of the first substrate 100 is thinned and followed by drilling, etching or notching to form a third through hole 180 which passes through the first substrate 100 and part of the first inter-layered dielectric layer 110 and exposes the bottom of the second conductive pad 118.

Figure 1G:
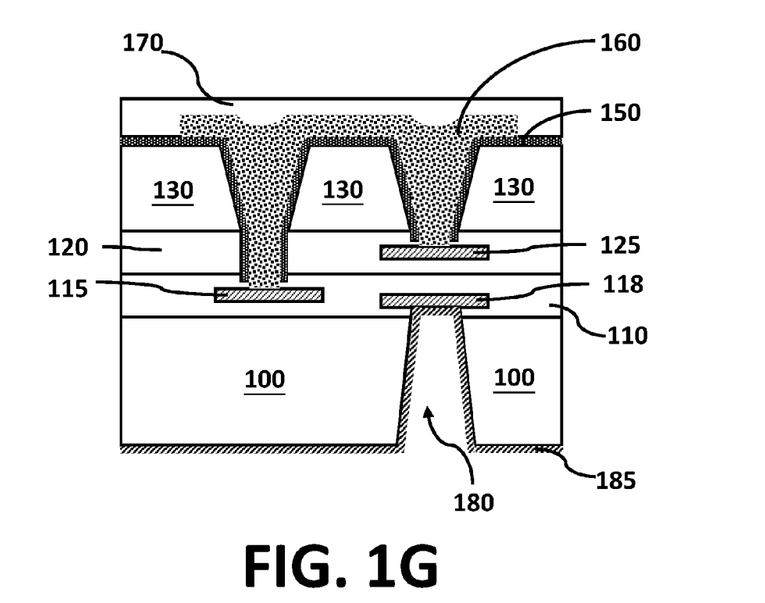

Next, please refer to FIG. 1G. A second insulating layer 185 is formed on the first bottom surface 100b of the first substrate 100 and the inner wall and the bottom of the third through hole 180.

Figure 1H:
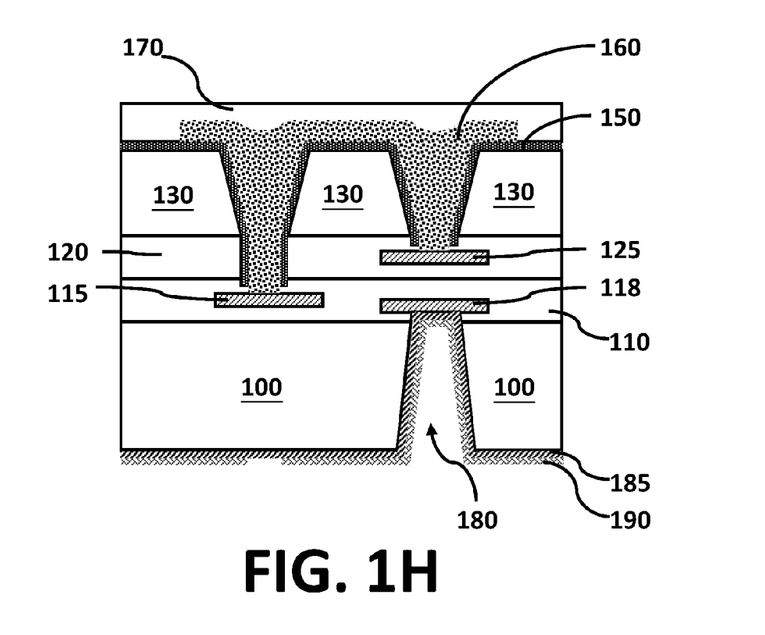

Next, please refer to FIG. 1H. A third via (not shown) exposing the bottom of the second conductive pad 118 is formed by removing all or part of the second insulating layer 185 within the bottom of the third through hole 180. Then, a second re-distribution layer 190 is formed on the second insulating layer 185 and electrically connected to the second conductive pad 118 through the third via (not shown).

Figure 1I:
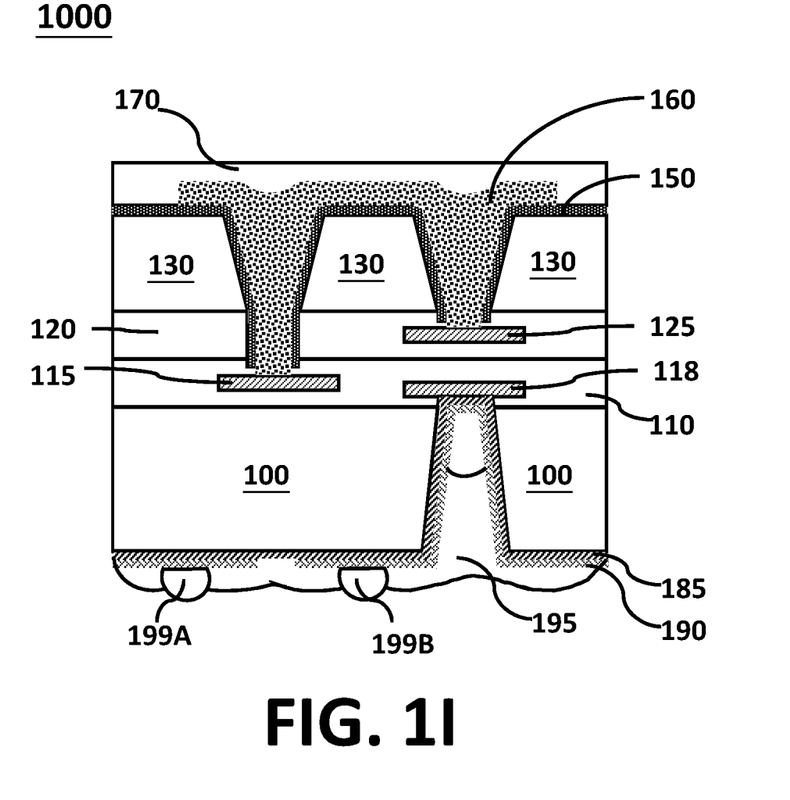

Finally, please refer to FIG. 1I. A second passivation layer 195 having a fourth via (not shown) and a fifth via (not shown) exposing the second re-distribution layer 185 are formed on the second re-distribution layer 190. Then, a first conductive structure 199A and a second conductive 199B are formed in the fouth via (not shown) and the fifth via (not shown) to interconnect the second re-distribution layer 190 respectively to generate a sensing chip package 1000 according to the embodiment 1 of this invention.

Exemplary Embodiment 2

A detailed description of the touch panel-sensing chip package module complex and a method of manufacturing the same according to embodiment 2 of this invention is given below with reference to the accompany FIGS. 2A-2I.

Figure 2A:
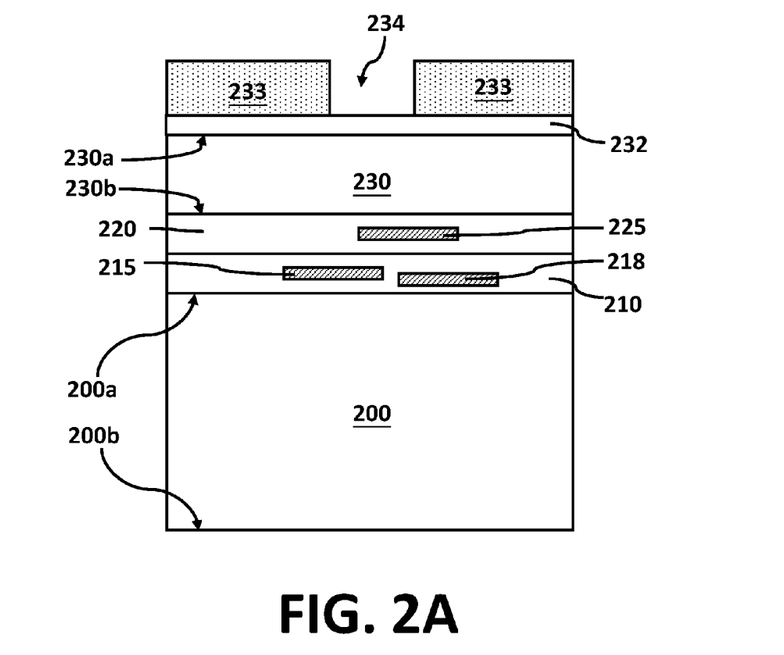
FIGS. 2A~2I are cross-sectional views of the exemplary embodiment 2 of a method of manufacturing a sensing chip package according to this present invention.

First, please refer to FIG. 2A. A first substrate 200 having a first top surface 200a and a first bottom surface 200b opposite to each other is provided, wherein a first inter-layered dielectric layer (ILD) 210 comprising a first conductive pad 215 and a second conductive pad 218 is formed on the first top surface 200a of the first substrate 200. Next, a second substrate 230 having a second top surface 230a and a second bottom surface 230b opposite to each other is provided, wherein a second inter-layer dielectric layer (ILD) 220 comprising a third conductive pad 225 is formed on the second bottom surface 230b of the second substrate 230. Then, the second substrate 230 is pressed to bond to the first inter-layered dielectric layer 210 on the first substrate 200 by means of the second inter-layered dielectric layer 220. Thereafter, a first insulating layer 232 is deposited on the second top surface 230b of the second substrate 230, then a photoresist pattern 233 having an opening 234 is formed on the first oxide layer 232. The first substrate 200 and the second substrate 230 of this embodiment are both silicon wafers comprising image sensors, and the first insulating layer 232 is consisted of oxide such as silicon oxide. Moreover, the first conductive pad 215 overlaps with the third conductive pad 225.

Figure 2B:
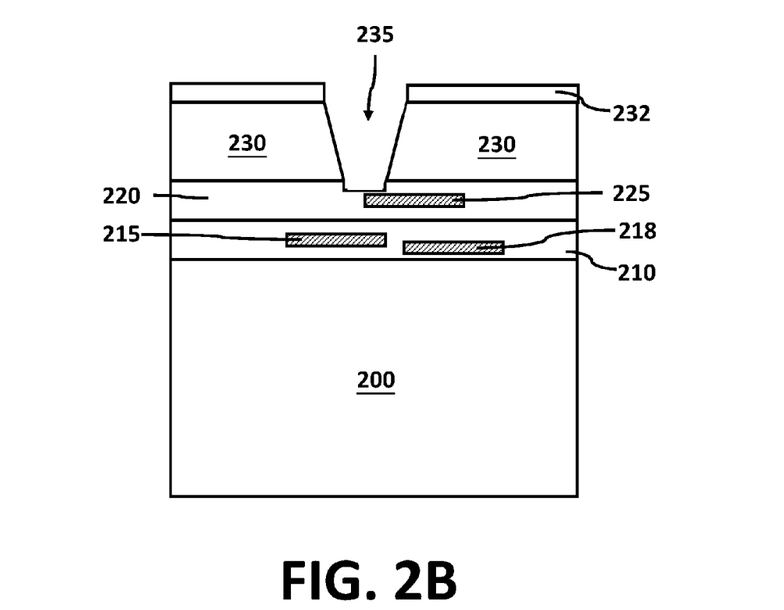

Next, please refer to FIG. 2B. An opening 235A corresponding to the first conductive pad 215 and the second conductive pad 225 is formed by etching the exposed first oxide layer 232, second substrate 230 and part of the second inter-layered dielectric layer 225 under the opening 234.

Figure 2C:
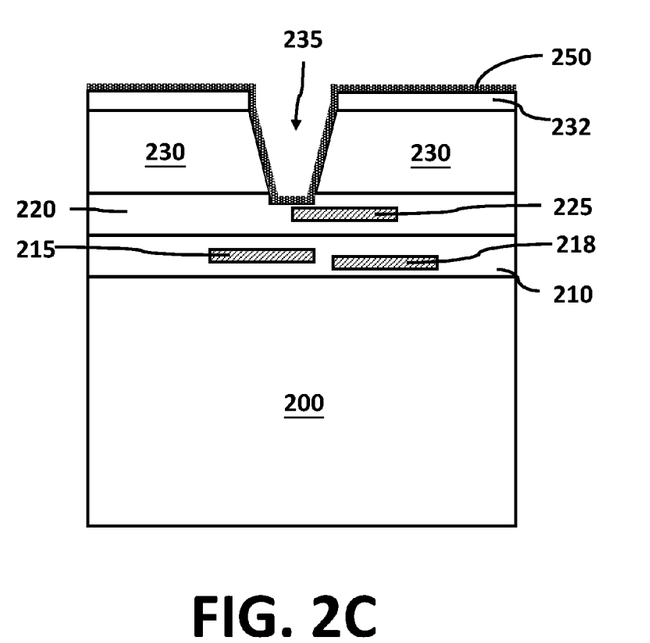

Next, please refer to FIG. 2C. A second insulating layer 250 is deposited on the second top surface 230a of the second substrate, and the side-wall and bottom of the opening 235, wherein the second insulating layer 250 is consisted of oxide such as silicon oxide.

Figure 2D:
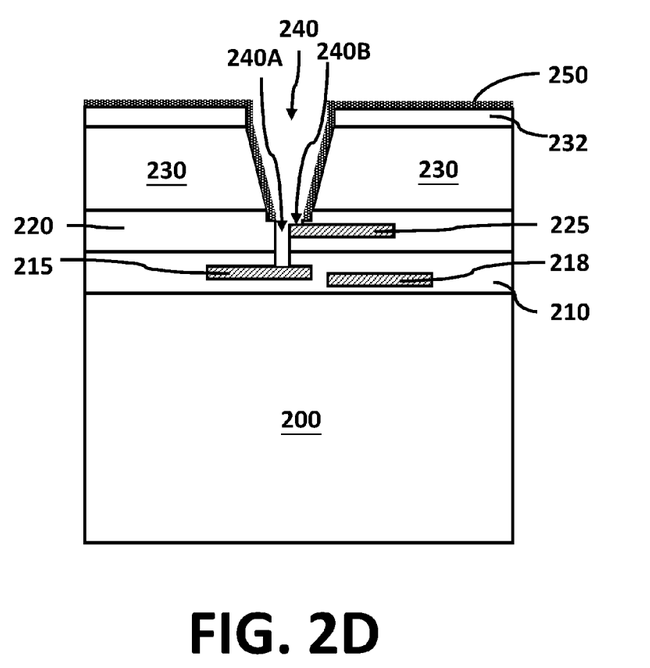

Next, please refer to FIG. 2D. A fourth through hole 240 is formed by removing part or all of the second insulating layer 250 on the bottom of the opening 235 to form a fourth through hole 240 comprising a first region (not shown) corresponding to the first conductive pad 215 and a second region (not shown) corresponding to the second conductive pad 225. Then, a fifth through hole 240A exposing the top of the first conductive pad 215 is formed by etching away the second inter-layered dielectric layer 220 and part of the first inter-layered dielectric layer 210 under the first region (not shown) of the fourth through hole 240, and a sixth through hole 240B exposing the top of the third conductive pad 225 is formed by removing part of the second inter-layered dielectric layer 220 under the second region (not shown) of the fourth through hole 240, whereby the fourth through hole 240 interlinks with the fifth and the sixth through holes 240A and 240B.

Figure 2E:
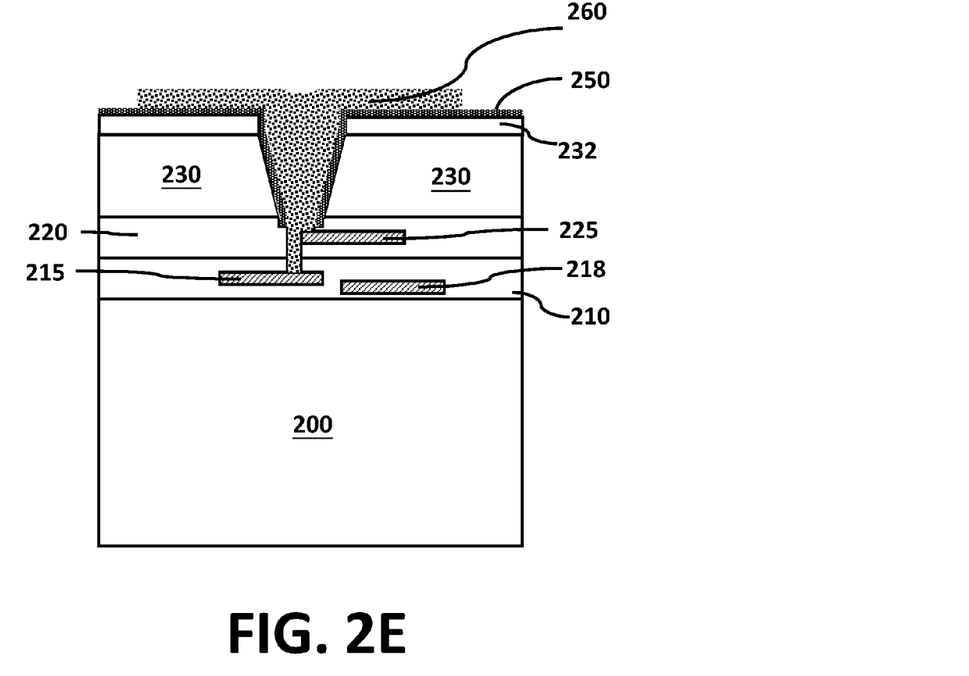

Next, please refer to FIG. 2E. A first re-distribution layer 260 is formed on the second insulating layer 250 and gap-filled into the fourth through hole 240, the fifth through hole 240A and the sixth through hole 240B by sputtering to respectively interconnect the first conductive pad 215 and the third conductive pad 225. The first re-distribution layer 260 of this embodiment is consisted of a material comprising aluminum, and an adhesive material such as chromium, titanium or titanium tungsten can be sandwiched between the first insulating layer 250 and the first re-distribution layer 260 to increase the adhesion between the first re-distribution layer 260 consisted of a material comprising aluminum and the first conductive pad 215 and the third conductive pad 225.

Figure 2F:
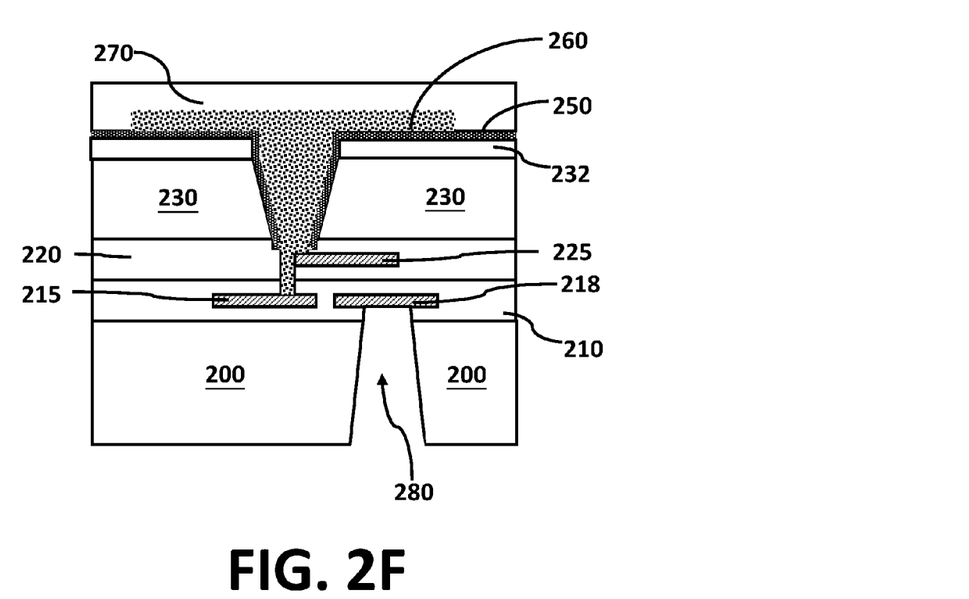

Next, please refer to FIG. 2F. A first passivation layer 270 is formed on the second top surface 230a of the second substrate 230 and overlaid the first re-distribution layer 260 and the second insulating layer 250. Then, the first bottom surface 200b of the first substrate 200 is thinned and followed by drilling, etching or notching to form a seventh through hole 280 which passes through the first substrate 200 and part of the first inter-layered dielectric layer 210 and exposes the bottom of the second conductive pad 218.

Figure 2G:
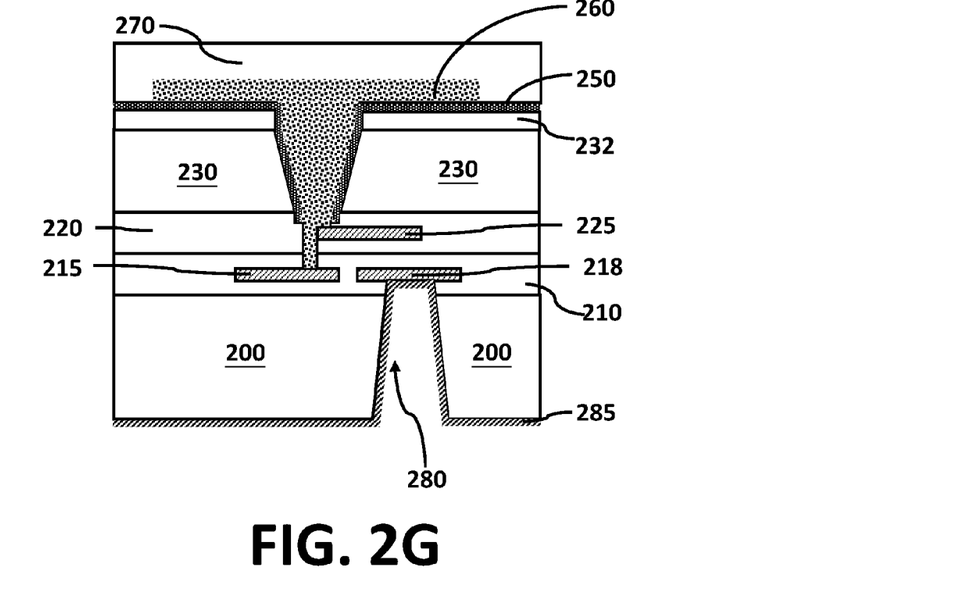

Next, please refer to FIG. 2G. A second insulating layer 285 is formed on the first bottom surface 200b of the first substrate 200 and the inner-wall and the bottom of the seventh through hole 280.

Figure 2H:
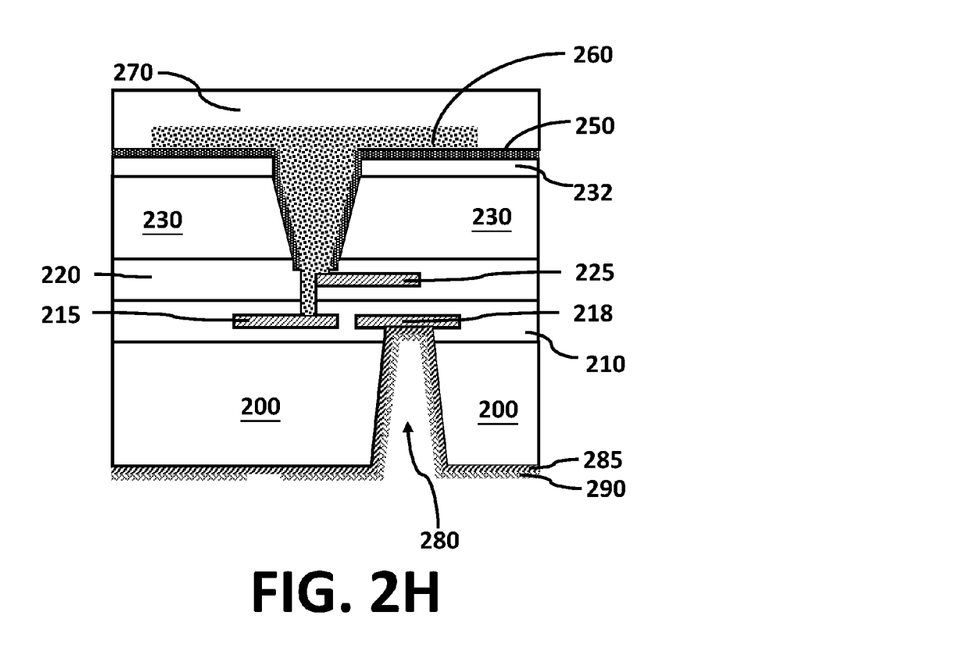

Next, please refer to FIG. 2H. A seventh via (not shown) exposing the bottom of the second conductive pad 218 is formed by removing all or part of the second insulating layer 285 under the bottom of the seventh through hole 280. Then, a second re-distribution layer 290 is formed on the second insulating layer 285 and electrically connected to the second conductive pad 218 through the seventh via (not shown).

Figure 2I:
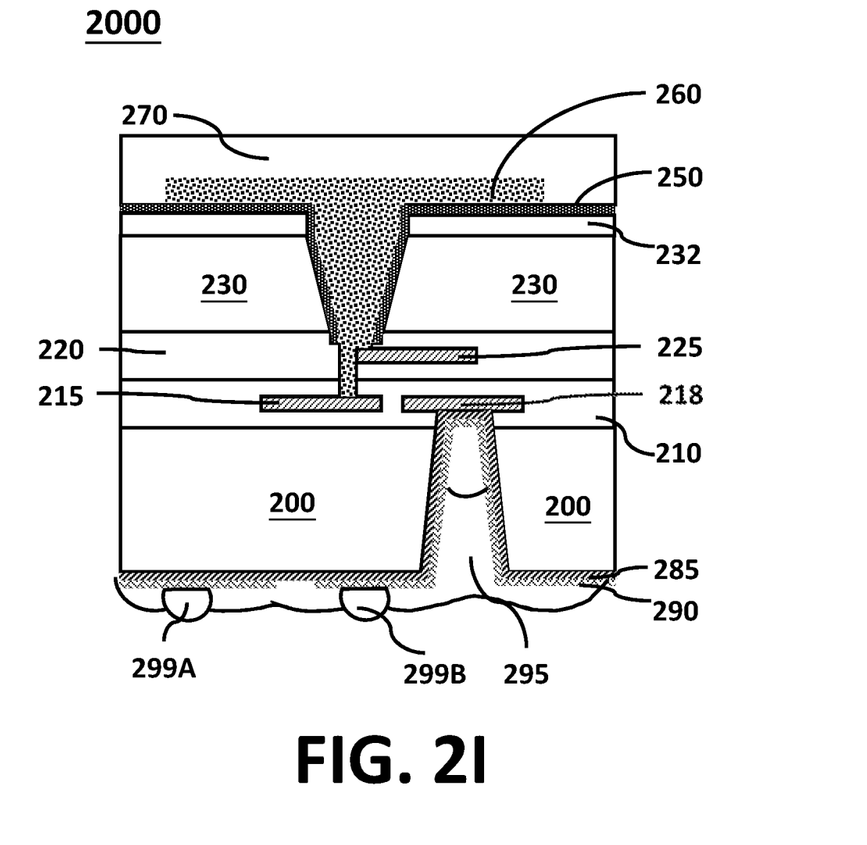

Finally, please refer to FIG. 2I. A second passivation layer 295 having an eighth via (not shown) and a ninth via (not shown) exposing the second re-distribution layer 285 are formed on the second passivation layer 295. Then, a first conductive structure 299A and a second conductive 299B are formed in the eighth via (not shown) and the ninth via (not shown) to interconnect the second re-distribution layer 290 respectively to generate a sensing chip package 2000 according to the embodiment 2 of this invention.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method of manufacturing a sensing chip package, comprising the steps of:
    providing a first substrate, having a first top surface and a first bottom surface opposite to each other, and a first inter-layered dielectric layer (ILD) comprising a first conductive pad and a second conductive pad formed on the first top surface;
    providing a second substrate, having a second top surface and a second bottom surface opposite to each other, and a second inter-layer dielectric layer (ILD) comprising a third conductive pad formed on the second bottom surface wherein the first conductive pad partially overlaps with the third conductive pad;
    pressing the second substrate to bound to the first inter-layer dielectric layer (ILD) of the first substrate by means of the second inter-layer dielectric layer (ILD);
    forming a first insulating layer on the second top surface of the second substrate;
    forming a single photoresist pattern on the first insulating layer with a hole exposing part of the first insulating layer;
    forming an opening passing through the first insulating layer by removing the first insulating layer exposed by the hole, the second substrate and part of the second inter-layered dielectric layer beneath;
    removing the photoresist pattern;
    forming a second insulating layer on the first insulating layer and the side-wall and the bottom of the opening;
    removing part or all of the second insulating layer on the bottom of the opening to form a first through hole comprising a first region corresponding to the first conductive pad and a second region corresponding to the second conductive pad;
    removing the second inter-layered dielectric layer and part of the first inter-layered dielectric layer under the first region corresponding to the first through hole to form a second through hole exposing the top of the first conductive pad, and removing the second inter-layered dielectric layer under the second region corresponding to the first through hole to form a third through hole exposing the top of the third conductive pad, whereby the first through hole interlinks with the second and the third through hole;
    forming a first re-distribution layer on the first insulating layer and gap-filling into the first through hole, the second through hole and the third through hole, and respectively interconnecting the first conductive pad and the third conductive pad; and
    forming a passivation layer formed on the second top surface of the second substrate, and overlying the first re-distribution layer and the second insulating layer.

2. The method of manufacturing a sensing chip package as claimed in claim 1, wherein the first re-distribution further comprises an adhesion layer consisted of a material selected from chromium, titanium or titanium tungsten.

3. The method of manufacturing a sensing chip package as claimed in claim 1, further comprising following steps of:
    thinning the first bottom surface of the first substrate;
    forming a fourth through hole passing through the first substrate and part of the first inter-layered dielectric layer to expose the bottom of the second conductive pad;
    forming a third insulating layer on the first bottom surface of the first substrate and the inner-wall and the bottom of the seventh through hole;
    removing all or part of the third insulating layer on the bottom of the seventh through hole to form a first via exposing the bottom of the second conductive pad;
    forming a second re-distribution layer on the third insulating layer, and interconnected the second conductive pad through the first via;
    forming a second passivation layer formed on the second re-distribution layer, and the second passivation layer having a second via and a third via exposing the second re-distribution respectively; and
    forming a first and a second conductive structures respectively in the second via and the third via to independently interconnect the second re-distribution layer.

4. The method of manufacturing a sensing chip package as claimed in claim 3, the first conductive structure and the second conductive structure comprising solder balls, solder bumps and conductive pillars.

* * * * *